United States Patent [19]

Schmidt et al.

[11] 4,159,891
[45] Jul. 3, 1979

[54] CRUCIBLE

[75] Inventors: Walter Schmidt, Schaffhausen, Switzerland; Franz Sperner, Hanau, Fed. Rep. of Germany; Walter Stählin, Schaffhausen, Switzerland

[73] Assignee: Prolizenz AG, Chur, Switzerland

[21] Appl. No.: 825,990

[22] Filed: Aug. 10, 1977

Related U.S. Application Data

[63] Continuation of Ser. No. 664,700, Mar. 8, 1976, abandoned.

[30] Foreign Application Priority Data

Mar. 12, 1975 [DE] Fed. Rep. of Germany ....... 2510684

[51] Int. Cl.² .................. F27B 14/00; F27B 14/10
[52] U.S. Cl. .................................... 432/264; 13/35; 422/248; 422/102; 156/DIG. 83
[58] Field of Search .......... 23/273 SP, 292; 156/DIG. 83; 13/35; 432/263–265; 422/102, 248

[56] References Cited

U.S. PATENT DOCUMENTS

| 1,675,119 | 6/1928 | Marden | 432/264 |
|---|---|---|---|
| 2,195,436 | 4/1940 | Weller | 23/292 X |
| 2,947,114 | 8/1960 | Hill | 432/264 |
| 3,430,937 | 3/1969 | Spitzer | 432/264 X |
| 3,694,165 | 9/1972 | Kramer | 23/273 SP |
| 3,698,872 | 10/1972 | Reusser | 23/273 SP |
| 4,052,153 | 10/1977 | Borer et al. | 432/264 X |

FOREIGN PATENT DOCUMENTS 1093779 12/1960 Fed. Rep. of Germany ........... 432/265

OTHER PUBLICATIONS

I.B.M. Tech. Disclosure, vol. 15, No. 5, 10/72, Yin et al., Employment of Neutral Ambient Gas in Iridium Crucibles.

Primary Examiner—Michael S. Marcus
Attorney, Agent, or Firm—Bachman and LaPointe

[57] ABSTRACT

A crucible, especially for containing melts, has multi-layered walls with an inner core of heat resistant material. A continuous coating layer of temperature resistant material is supported on the core. The coating layer at least partially defines a reservoir for melts to be contained in the crucible, and is composed of material resistant to attack by hot melts.

16 Claims, 4 Drawing Figures

CRUCIBLE

This is a continuation of application Ser. No. 664,700, filed Mar. 8, 1976 and now abandoned.

CROSS REFERENCE TO RELATED APPLICATION

The instant application is directed to related subject matter of corresponding application Ser. No. 661,439 filed Feb. 26, 1979 now U.S. Pat. No. 4,049,250; application Ser. No. 661,434 filed Feb. 26, 1976 now U.S. Pat. No. 4,052,153; application Ser. No. 661,433, filed Feb. 26, 1976, now U.S. Pat. No. 4,055,391 and application Ser. No. 661,438, filed Feb. 26, 1976, now U.S. Pat. No. 4,073,355.

BACKGROUND OF THE INVENTION

The invention relates to a crucible having multi-layered walls. More particularly, the instant invention relates to a crucible especially adapted for receiving a melt for drawing crystals, in particular of single crystals according to the Czochralski process.

The Czochralski process is well known and has been described in many texts dealing with the subject of crystal growth, for example "The Growth of Crystals" Prentice Hall, Inc. 1970, page 174 ff. Library of Congress Catalog Card No. 77-104173.

A requirement for such a crucible is that it be resistant to attack by the high melting point melts normally used in this process as well as that it be resistant to oxygen or oxidizing substances at high temperatures.

Crucibles normally used for this purpose are composed of a platinum metal; for example, iridium, with a melting point of 2,454° C., has been found particularly useful. In general, a melt is prepared in an iridium crucible at about 1800° C. and thereafter a seed crystal is introduced. The seed crystal is slowly withdrawn from the melt, under controlled conditions of temperature and withdrawal velocity, and a cylindrical crystal is thereby formed on the seed crystal.

The disadvantage of conventional iridium crucibles lies in their relatively short useful life and the high cost of replacing or remaking the iridium crucible. Iridium is expensive and must be processed at temperatures in the order of 1200° C.

The short usable life of the iridium crucible is a result of corrosion by the melt, which becomes progressively more rapid as the surface area of the inside of the crucible increases due to the roughening effect of corrosion.

The rate of corrosion is highly dependent on the temperature of the crucible. Corrosion rates increase with increasing temperature. As it is common to heat such crucibles by means of high frequency induction coils, the problem of corrosion is increased due to hot spots or uneven temperature gradients which occur across the normally non-homogenous crucible as a result of heating by induction.

When the corrosion progresses to the point that the crucible can no longer function properly, the crucible is subjected to processing: the iridium content of the crucible is reclaimed and remolded into a new crucible. As noted above, the iridium can be processed only at a temperature of about 1200° C. and the cost of replacing the iridium lost by corrosion is high.

Desirable features for a crucible include a minimum use of expensive iridium and a reduction of the losses of the iridium. Additionally, it is desirable to protect the melt from contamination from crucible materials.

SUMMARY OF THE INVENTION

One of the principal objects of the instant invention is to provide a crucible which uses less than the previously used amount of iridium and therefore has a lower initial cost. Another object of the invention is to reduce the rate of loss of the iridium used in the crucible.

Further objects and advantages of the invention will be set forth in part in the following specification and in part will be obvious therefrom without being specifically referred to, the same being realized and attained as pointed out in the claims hereof.

With the above and other objects of the invention in view the invention consists in the novel construction, arrangement and combination of various elements and parts, as set forth in the claims hereof, certain embodiments of the same being illustrated in the accompanying drawings and described in the specifications.

In general, the invention comprises a support body such as a core, and a continuous coating layer of temperature resistant material such as iridium, supported thereon to form the crucible reservoir. In one embodiment, a removable shell is provided which can be easily replaced when the corrosion on the shell has reached the point at which the shell is no longer usable. Another embodiment protects the support body by having the coating layer completely envelop the body. In still further embodiments a high temperature resistance oxide intermediate layer is formed between the support body and the coating layer to prevent diffusion between the coating layer and the support body. A high temperature resistant oxide barrier layer may be formed on the exposed surface of the coating layer to prevent the evaporation of the oxide of the coating layer therefrom, and thereby reduce the loss of metal from the coating layer.

The invention accordingly comprises the features of construction, combination of elements and arrangement of parts which will be exemplified in a construction hereinafter set forth in the scope of the application of which will be indicated in the claims.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENTS

In carrying the invention into effect some embodiments have been selected for illustration in the accompanying drawings and for description in the specification, reference is had to FIGS. 1A, 1B, 2A, and 2B.

Figure 1A:
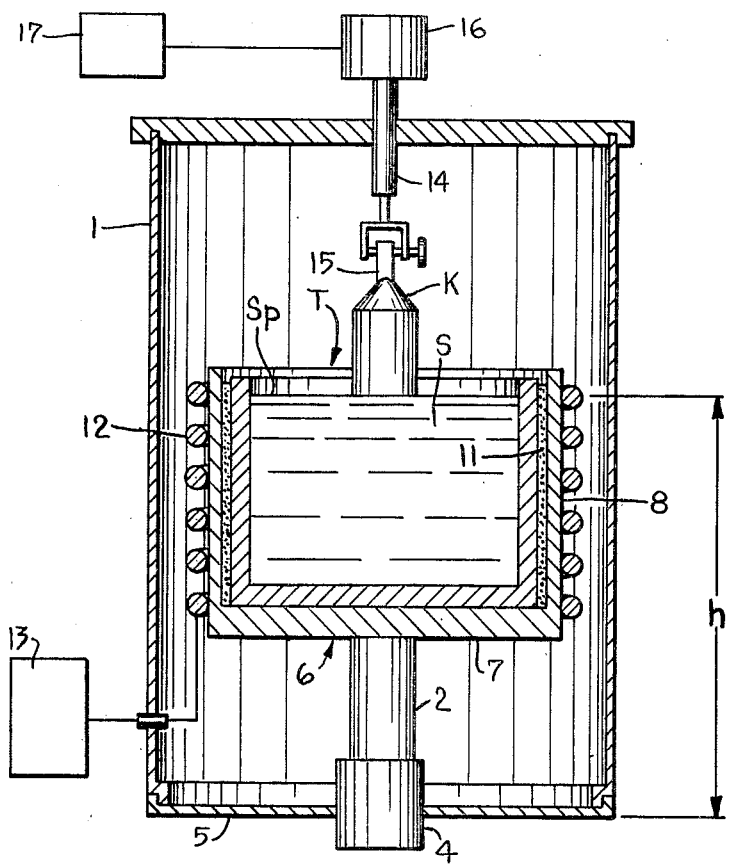
FIG. 1A shows a vertical sectional view of an embodiment of a crystal drawing device.
Figure 1B:
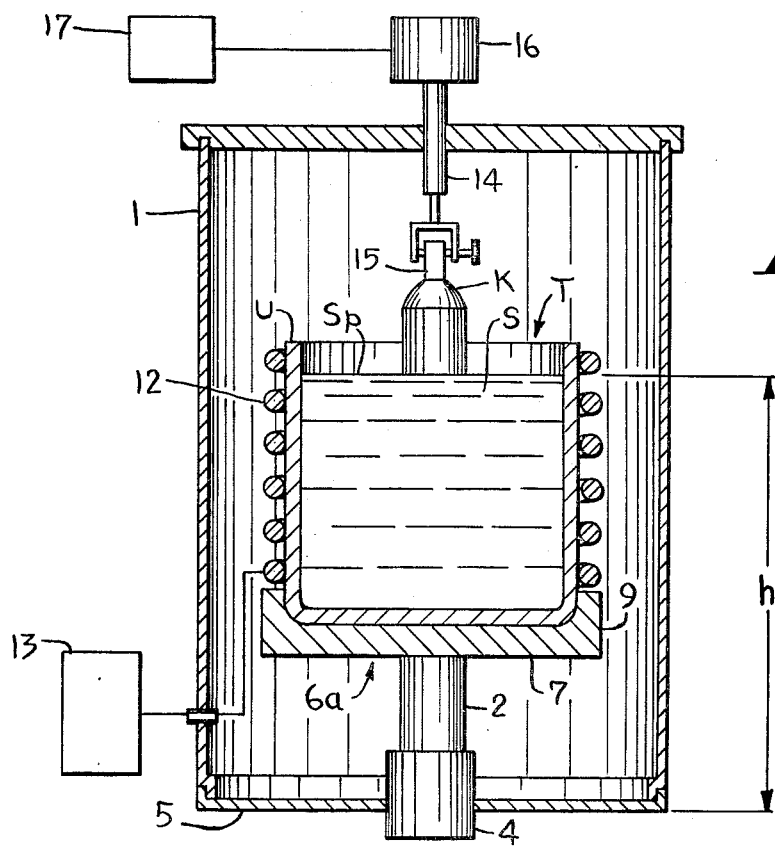
FIG. 1B shows a vertical sectional view of another embodiment of a crystal growing device.

Generally, FIGS. 1A and 1B show a device for growing a single crystal according to the Czochralski process. A housing 1 encloses a supporting device 6, 6a. A shaft 2 can be vertically displaced by a member 4 so that the level "Sp" of a melt "S" in the crucible "T" is kept a constant distance "h" from the bottom surface 5 of the housing 1. FIG. 1A shows the supporting device 6 including a bottom plate 7 and an insulating wall 8 whereas the embodiment in the FIG. 1B shows the supporting device 6a including a bottom plate 7 with annular flange 9.

In FIG. 1A, the cylindrical vertical wall "U" of the crucible T and the insulating wall 8 define an annular region 10 which is filled with powdered aluminum oxide 11.

Heat is generated by a high-frequency induction coil 12 connected to a high-frequency generator 13.

A seed crystal 15 extends from a vertical drawing-rod 14 in the melt S and is slowly withdrawn by a drawing member 16 with the formation of a crystal "K." The drawing member 16 is operated by a control device 17.

Figure 2A:
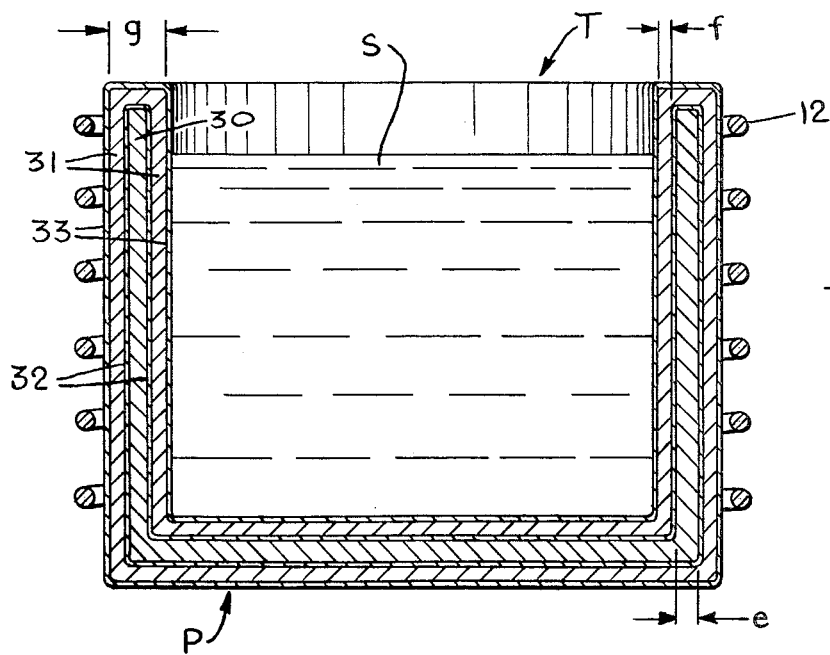
FIG. 2A shows a partial vertical sectional view of an embodiment of a crucible according to the instant invention.
Figure 2B:
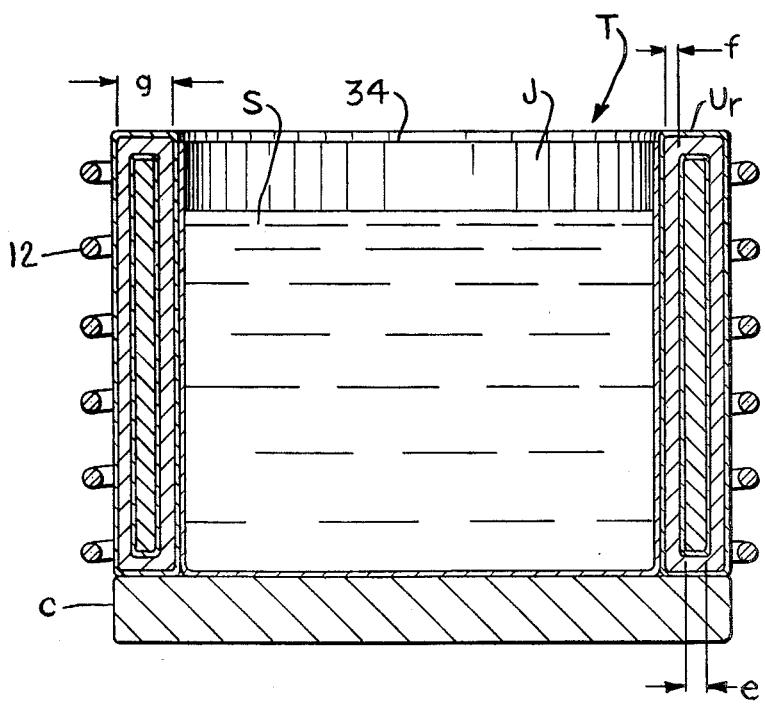
FIG. 2B shows a partial vertical sectional view of another embodiment of a crucible according to the instant invention.

FIG. 2A and 2B show a crucible T formed as a multi-layered plate "P" of a thickness "g." The crucible T may be formed by deep-drawing, and the thickness g is usually about 4 mm. A continuous coating layer or shell 31, the thickness "f" of which is usually about 0.5 mm, envelops all sides of an internal core or support body 30, as shown in FIGS. 2A and 2B. The thickness "e" of this support body 30 is preferably around 1.55 mm and it may be composed of a tantalum tungsten alloy, for instance a tantalum/ten percent tungsten alloy. When the coating or shell 31 is composed of iridium, a high temperature resistant oxide intermediate layer 32 is preferably disposed between the coating layer 31 and the support body 30 to prevent diffusion between the iridium and the tantalum-tungsten support body 30. It has been found suitable to spray zirconium oxide by plasma spray method onto the core or support body 30 to form the intermediate layer 32.

The embodiment shown in FIG. 2A has a circumferential wall "$U_r$" of multi-layer construction, as described above. In this embodiment, however, the wall does not form the bottom, but rather the bottom is a separately constructed slab "C" of high temperature resistant material, for example, magnesium oxide. An additional lining or shell 34 is supported within the structure. This shell 34 is composed of a high temperature resistant material such as the platinum metals. Iridium has been found particularly suitable.

The lined inner area "J" of the crucible T forms the melt reservoir during melting or, when used for crystal growing, constitutes a growth area for the crystal K (see FIG. 1). The crystal K is drawn from the melt substance S at a temperature of about 1800° C. As stated earlier, the high temperature of the crucible T is normally produced by the high-frequency heating induction coil 12.

OPERATION

The operation of the above described embodiments of the invention is as follows:

As shown in FIG. 2A, the support body 30 supports a continuous coating layer or shell 31. This permits the use of less material for the coating layer 31, which material, because of the stringent physical and chemical requirements, is quite expensive. The support body 30 need only be heat resistant and be made thick enough to support the weight.

The continuous coating layer 31 may also be formed around the outside of the support body 30 to protect it from reaction with atmospheric gases.

The intermediate layer 32 acts to retard diffusion of the materials used in the coating layer 31 into the materials used in the support body 30. An additional layer such as the barrier layer 33, of similar material to that used in the intermediate layer 32 may also be used on the external surface of the continuous coating layer 31. The barrier layer 33 acts to retard the evaporation of oxides of the metal for example iridium oxide, from which the continuous coating layer 31 is formed.

The embodiment shown in FIG. 2A shows an outer wall $U_r$ constructed as described above for the walls of the embodiment shown in FIG. 2B. The wall $U_r$, however, does not form the bottom of the crucible as well. The bottom C may be made of other heat resistant materials such as magnesium oxide. A shell 34 is supported by the wall $U_r$ and the bottom C, and defines the reservoir. In this embodiment, the shell may easily be removed for replacement.

I wish it to be understood that I do not desire to be limited to the exact details of construction shown and described, for obvious modifications will occur to a person skilled in the art.

Having thus described the invention what I claim as new and desire to be secured by Letters Patent is as follows:

1. A crucible for use in heating and retaining melts at elevated temperatures of 1800° C. or above comprising, in combination:
   a circumferential side wall portion;
   a bottom wall portion adapted to form with said circumferential side wall portion a crucible chamber;
   said circumferential side wall portion comprises a support body composed of a refractory metal alloy;
   a continuous coating layer composed of a metal or combination of metals chosen from the group consisting of the platinum metals and completely enveloping said support body; and a high-temperature resistant oxide intermediate layer disposed between said support body and said coating layer wherein said intermediate layer prevents diffusion between the coating layer and the support body.

2. A crucible as claimed in claim 1, wherein said continuous metal layer is encompassed by an additional layer of said high-temperature resistant oxide.

3. A crucible as claimed in claim 1, wherein said metal of said coating layer consists essentially of iridium.

4. A crucible as claimed in claim 1, wherein said coating layer is iridium, and said intermediate layer is zirconium oxide.

5. A crucible as claimed in claim 1, wherein the thickness of said support body is about 3 times the thickness of said coating layer.

6. A crucible as claimed in claim 1, wherein the thickness of said coating layer is about equal to the thickness of said intermediate layer.

7. A crucible as claimed in claim 1, wherein said refractory metal alloy is a tantalum-tungsten alloy.

8. A crucible as claimed in claim 1 wherein said bottom wall portion is integral with and composed of the same materials as said circumferential side wall portion.

9. A crucible as claimed in claim 1, wherein said coating layer has an external surface, and further comprising an additional barrier layer disposed on the external surface of said coating layer wherein said barrier layer retards the evaporation of oxides of said metal of said coating layer.

10. A crucible layer as claimed in claim 9, wherein said barrier layer is zirconium oxide.

11. A crucible as claimed in claim 9 including a removable shell defining a receptacle and being composed of a metal or combination of metals chosen from the group consisting of the platinum metals, said shell being received within said chamber defined by said bottom wall portion and said circumferential wall portion.

12. A crucible as claimed in claim 11 wherein said bottom wall of high-temperature resistant material is adapted to separably mate with said support body.

13. A crucible for use in heating and retaining melts at elevated temperatures comprising, in combination:
 a circumferential side wall portion;
 a bottom wall portion separable from said circumferential side wall portion and adapted to form with said side wall portion a crucible chamber;
 said circumferential side wall portion comprises a support body composed of a refractory metal alloy;
 a continuous coating layer composed of a metal or combination of metals chosen from the group consisting of the platinum metals and completely enveloping said support body; and
 a high-temperature resistant oxide intermediate layer disposed between said support body and said coating layer wherein said intermediate layer prevents diffusion between said coating layer and said support body.

14. A crucible as claimed in claim 13, wherein said bottom wall portion is composed of magnesium oxide.

15. A crucible as claimed in claim 14 wherein said coating layer has an external surface, and further comprising an additional barrier layer disposed on the external surface of said coating layer.

16. A crucible as claimed in claim 15 including a removable shell defining a receptacle and being composed of a metal or combination of metals chosen from the group of the platinum metals, said shell being received within said chamber defined by said circumferential side wall portion and said bottom wall portion.

* * * * *